United States Patent
Littau et al.

[11] Patent Number: 5,858,464
[45] Date of Patent: Jan. 12, 1999

[54] METHODS AND APPARATUS FOR MINIMIZING EXCESS ALUMINUM ACCUMULATION IN CVD CHAMBERS

[75] Inventors: Karl Littau, Palo Alto; Dashun S. Zhou, Sunnyvale; Alfred Mak, Union City; Ling Chen, Sunnyvale, all of Calif.

[73] Assignee: Applied Materials, Inc., Santa Clara, Calif.

[21] Appl. No.: 791,131

[22] Filed: Feb. 13, 1997

[51] Int. Cl.$^6$ ..................................................... C23C 16/20
[52] U.S. Cl. ........................... 427/237; 427/238; 427/239; 427/248.1; 427/252; 427/255.1; 427/255.4
[58] Field of Search ..................................... 427/237, 238, 427/239, 255.4, 248.1, 255.1, 255.3, 252

[56] References Cited

U.S. PATENT DOCUMENTS

| | | | |
|---|---|---|---|
| 3,594,238 | 7/1971 | Hoeckelman | 148/6.3 |
| 3,746,569 | 7/1973 | Pammer et al. | 117/95 |
| 4,923,715 | 5/1990 | Matsuda et al. | 427/237 |
| 5,201,990 | 4/1993 | Chang et al. | 156/643 |
| 5,270,263 | 12/1993 | Kim et al. | 437/228 |
| 5,330,629 | 7/1994 | Cunningham et al. | 204/192.17 |
| 5,393,699 | 2/1995 | Mikoshiba et al. | 437/187 |
| 5,503,874 | 4/1996 | Ackerman et al. | 427/237 |
| 5,525,379 | 6/1996 | Takada et al. | 427/571 |
| 5,545,289 | 8/1996 | Chen et al. | 156/643.1 |

FOREIGN PATENT DOCUMENTS

| | | | |
|---|---|---|---|
| 115863 | 9/1978 | Japan | C23C 13/04 |

*Primary Examiner*—Shrive Beck
*Assistant Examiner*—Timothy Meeks
*Attorney, Agent, or Firm*—Townsend and Townsend and Crew LLP

[57] ABSTRACT

A method and apparatus for minimizing excess aluminum deposition that can build up inside a substrate processing chamber during an aluminum CVD substrate processing operation. The method of the present invention periodically introduces nitrogen into the processing chamber after aluminum CVD processing of at least a single wafer in order to minimize unwanted aluminum accumulation in various parts of the chamber. According to one embodiment, the present invention provides a method of minimizing excess metal deposition inside a substrate processing chamber after a substrate processing operation. The method includes the steps of introducing a nitrogen-containing passivating gas into a chamber after the substrate processing operation, and maintaining at least a portion of the chamber at a second temperature during the introducing step thereby reducing excess metal build up within the chamber. In preferred embodiments, the method is performed after removal of the substrate from the processing chamber. In other preferred embodiments, the second temperature ranges from about 200°–300° C.

22 Claims, 6 Drawing Sheets

METHODS AND APPARATUS FOR MINIMIZING EXCESS ALUMINUM ACCUMULATION IN CVD CHAMBERS

BACKGROUND OF THE INVENTION

The present invention relates to the fabrication of integrated circuits. More particularly, the invention provides methods and apparatus for preventing undesired aluminum deposition build-up that occurs during substrate processing. The present invention is particularly useful for aluminum chemical vapor deposition processing, but may also be useful for other types of substrate processing.

One of the primary steps in the fabrication of modern semiconductor devices is the formation of a metal film, such as an aluminum film, on a semiconductor substrate. Processes to form an aluminum film are often used in deposition of a metal layer or as part of the deposition process of metal interconnects between one metal layer and either the substrate or another metal layer. Conventionally, an aluminum film is formed on a substrate either by a sputter deposition process or by a chemical vapor deposition (CVD) process. In an exemplary sputter deposition system, a target (a plate of the aluminum material that is to be deposited) is connected to a negative voltage supply (direct current (DC) or radio frequency (RF)) while a substrate holder facing the target is either grounded, floating, biased, heated, cooled, or some combination thereof. A gas such as argon is introduced into the system, typically maintained at a pressure between a few millitorr (mtorr) and about 100 mtorr, to provide a medium in which a glow discharge can be initiated and maintained. When the glow discharge is started, positive ions strike the target, and target aluminum atoms are removed by momentum transfer. These target atoms subsequently condense into a thin aluminum film on the substrate, which is on the substrate holder. In a conventional thermal CVD process, reactive gases are supplied to the substrate surface where heat-induced chemical reactions take place to form the thin aluminum film over the surface of the substrate being processed. One exemplary thermal aluminum CVD process deposits aluminum over a semiconductor substrate from a process gas that includes dimethylaluminum hydride (DMAH) and a carrier gas such as argon. As is well known, aluminum CVD is a "selective" process in that aluminum prefers to deposit on a metallic surface. Once the deposition of aluminum on a metallic surface has begun, the deposited aluminum, itself a metal, supports further growth of aluminum. Although aluminum deposits on a metallic surface more rapidly than on an insulating surface, aluminum also will deposit on an insulator after a long incubation time.

One problem that arises during aluminum sputtering or aluminum CVD processes is that unwanted aluminum deposition occurs in the processing chamber and leads to potentially high maintenance costs. During aluminum deposition of a single wafer, some aluminum deposition is likely to occur on the heater and/or process kit if these are made of metal and even if these are partially or wholly made of an insulating material. During subsequent wafer depositions, this excess aluminum growth on the heater and/or process kit will accelerate until a continuous aluminum film is grown on the heater and/or process kit. Over time, this unwanted aluminum deposition, unless removed, may interfere with the performance of the processing chamber. To prevent chamber performance from being adversely affected by the accumulated aluminum, portions of the processing chamber (such as the heater, shadow ring, and/or gas distribution faceplate) may need to be removed and replaced periodically. Depending on which and how many parts need replacing and the frequency of the replacement, the cost of maintaining the deposition system can be very high.

This unwanted aluminum deposition problem is fairly easily solved for sputtering deposition systems. With sputtering deposition, aluminum deposition is limited to areas of the chamber which have an uninterrupted "line of sight" to some part of the target. Therefore, sputtering systems often utilize a shield ring or clamp ring to accumulate excess aluminum deposition and to protect the heated substrate holder from unwanted aluminum deposition. Typically about 3000–6000 wafers may be processed (about 0.3–0.6 mm total deposition) with an aluminum sputtering deposition system before excess deposition starts to interfere with the system's performance. Then, only the shield ring or clamp ring and one or two other process kit parts, not including the expensive heater, need to be removed and replaced to remove unwanted accumulations of aluminum in the sputtering system.

However, the problem of unwanted aluminum deposition is not so easily solved for aluminum CVD systems. Unlike sputtering deposition, aluminum deposition in CVD systems is not limited to certain areas of the chamber. With CVD, aluminum deposition can occur on any hot surface including the shadow ring and the heater, because the reactive gases can diffuse everywhere in the processing chamber, even between cracks and around corners in the processing chamber. Typically, about 5000 wafers may be processed (about 0.5 mm total deposition) with an aluminum CVD system before excess deposition starts to interfere with the system's performance. Then, the heater and other process kit parts (such as the shadow ring and gas distribution faceplate) may need to be removed and replaced to remove unwanted accumulations of aluminum in the CVD system. If not protected in some way from unwanted aluminum deposition, the heater and other process kit parts would become expensive consumable items that need to be replaced periodically in order to prevent chamber performance from being adversely affected.

Typical solutions to similar unwanted deposition problems faced in other non-aluminum CVD processes have been considered but found inadequate for solving the problem in aluminum CVD process. With these non-aluminum CVD processes, similar problems with excess deposition on the inside surfaces of the chamber have been minimized by utilizing reactive plasma cleaning and by using process kit parts constructed of materials resistant to the etching gas used in the cleaning. In these CVD processes, a reactive plasma cleaning is regularly performed to remove the unwanted deposition material from the chamber walls, heater, and other process kit parts of the processing chamber. Commonly performed between deposition steps for every wafer or every n wafers, this cleaning procedure is performed as a standard chamber cleaning operation where the etching gas is used to remove (etch) the unwanted deposited material. Common etching techniques include plasma CVD techniques that promote excitation and/or disassociation of the reactant gases by the application of RF energy to a reaction zone proximate the substrate surface. In these techniques, a plasma of highly reactive species is created that reacts with and etches away the unwanted deposition material from the chamber walls and other areas. However, with aluminum CVD processes, etching gases useful for etching aluminum contain chlorine, which is very reactive to many, if not most, of the materials which make up the chamber, heater, and process kit parts of the processing chamber. Therefore, using chlorine-containing etching gases makes it virtually impossible to effectively clean excess CVD aluminum film from an aluminum heater without also damaging the heater in the cleaning process. Even if the heater and/or process kit parts are constructed of materials resistant to the chlorine-containing etching gas used in the cleaning, unwanted aluminum deposition could still occur although at a slower rate. Thus, maintaining chamber performance may result in damage to expensive consumable items which need to be replaced frequently as a result.

From the above, it is seen that a method and apparatus are needed to minimize unwanted aluminum deposition on the heater, process kit parts, and chamber walls in aluminum CVD systems without causing damage to these components. Further, it is desirable that the method and apparatus extend the life span of these components to thereby reduce the need for and/or frequency of replacing expensive consumable items.

SUMMARY OF THE INVENTION

The present invention provides methods and apparatus for minimizing excess aluminum growth in an aluminum CVD or other type of processing chamber. The method of the present invention introduces nitrogen into the processing chamber periodically after aluminum CVD processing of at least a single wafer in order to minimize unwanted aluminum accumulation in various parts of the chamber.

According to one embodiment, the present invention provides a method of minimizing excess metal deposition inside a substrate processing chamber after a substrate processing operation. The method includes the steps of introducing a nitrogen-containing passivating gas into a chamber after the substrate processing operation, and maintaining at least a portion of the chamber at a second temperature during the introducing step thereby reducing excess metal build up within the chamber. In preferred embodiments, the method is performed after removal of the substrate from the processing chamber. In other preferred embodiments, the second temperature ranges from about 200°–300° C.

According to another embodiment, the present invention provides a method for fabricating an integrated circuit in a processing chamber. The present method includes steps of introducing a wafer into the chamber, performing a processing operation on the wafer in the chamber to deposit a desired metal film on the wafer and an undesired metal film on areas of the chamber, and removing the wafer from the chamber. The method also includes steps of introducing a nitrogen-containing passivating gas into the chamber after the wafer is removed from the chamber, maintaining pressure within the chamber at a particular pressure level, and maintaining at least a portion of the chamber at a particular temperature to passivate the undesired metal film to minimize unwanted metal deposition in the areas of the chamber.

These and other embodiments of the present invention, as well as its advantages and features are described in more detail in conjunction with the text below and the attached figures.

DETAILED DESCRIPTION OF THE SPECIFIC EMBODIMENTS

I. Exemplary CVD System

Figure 1A:
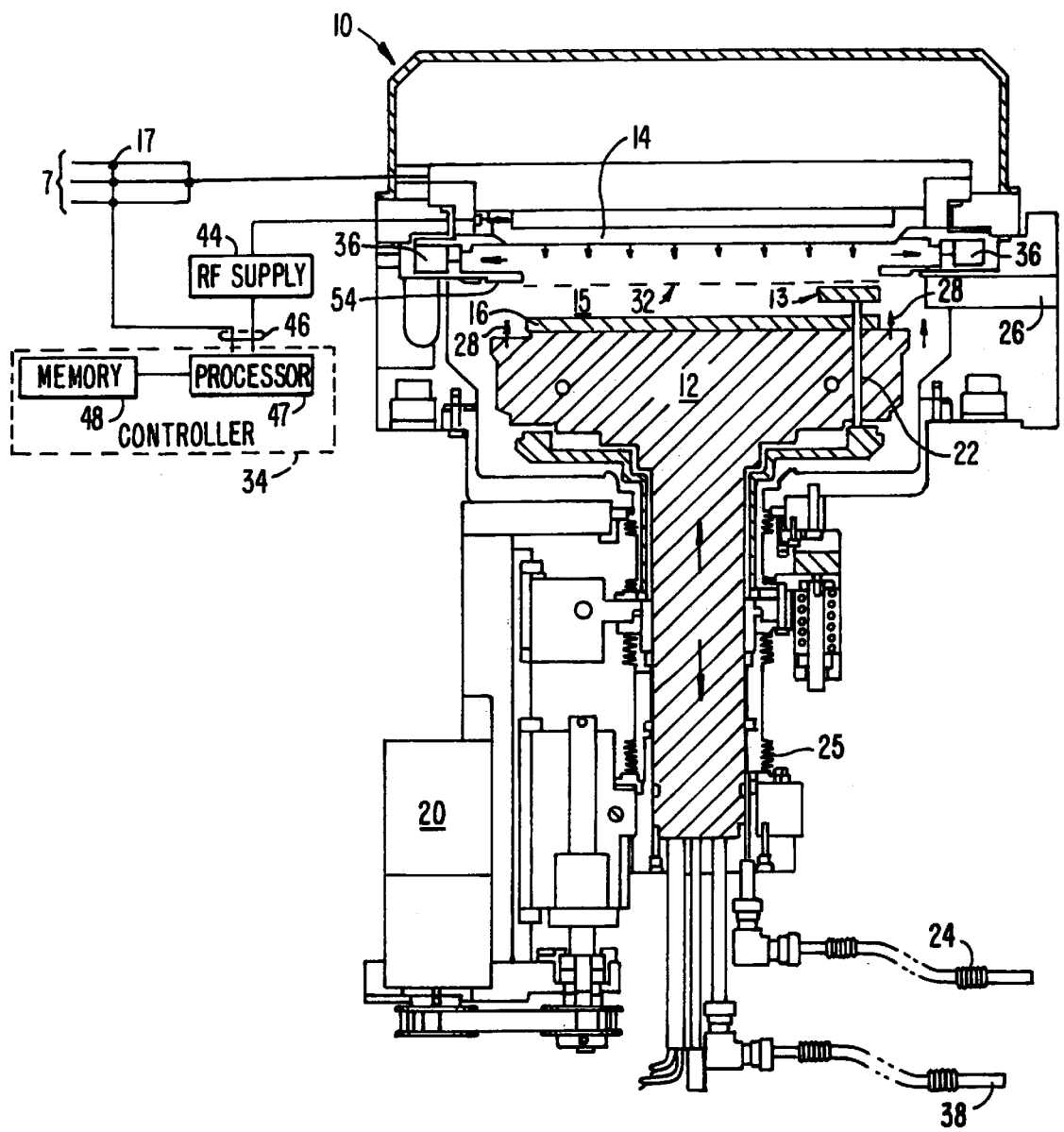
FIG. 1A is a vertical, cross-sectional view of one embodiment of a simplified chemical vapor deposition apparatus according to the present invention.
Figure 1B:
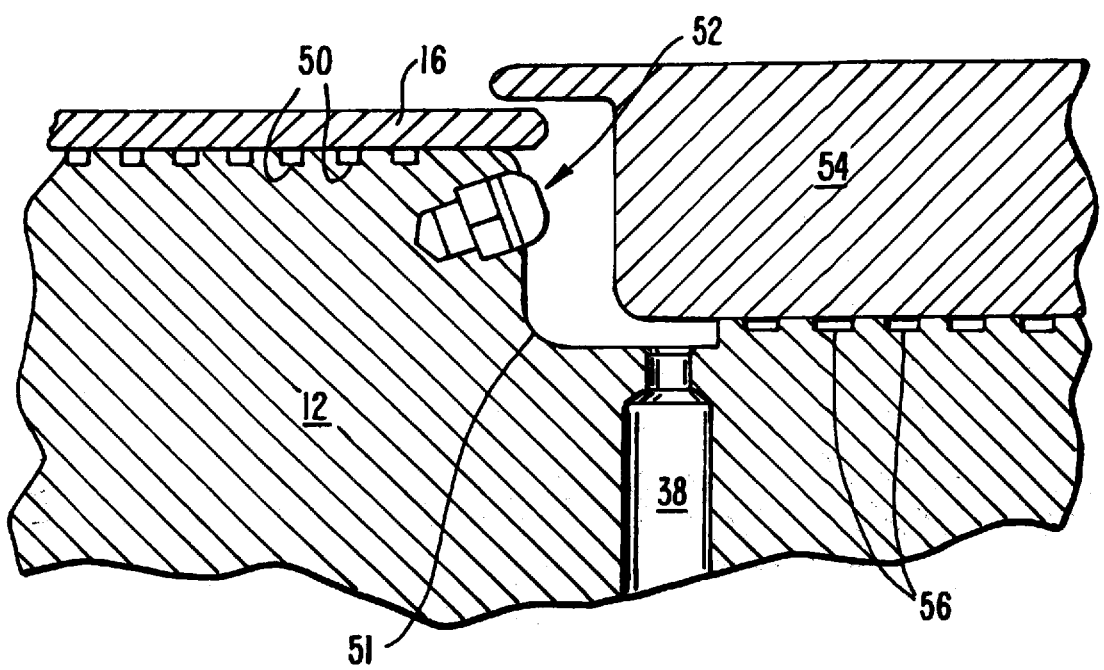
FIG. 1B is a vertical, cross-sectional view of one embodiment of a resistively-heated pedestal used in the chamber of FIG. 1A to secure a substrate being processed in chamber.

FIGS. 1A and 1B illustrate one embodiment of a parallel plate, cold-wall chemical vapor deposition (CVD) apparatus 10 having a vacuum chamber 15 in which an aluminum layer can be deposited and the method of minimizing excess aluminum accumulation according to the present invention can be used. CVD apparatus 10 contains a gas distribution plate (faceplate or manifold) 14 for dispersing deposition gases to a wafer 16 that rests on a resistively-heated pedestal (or heater) 12.

Figure 1C:
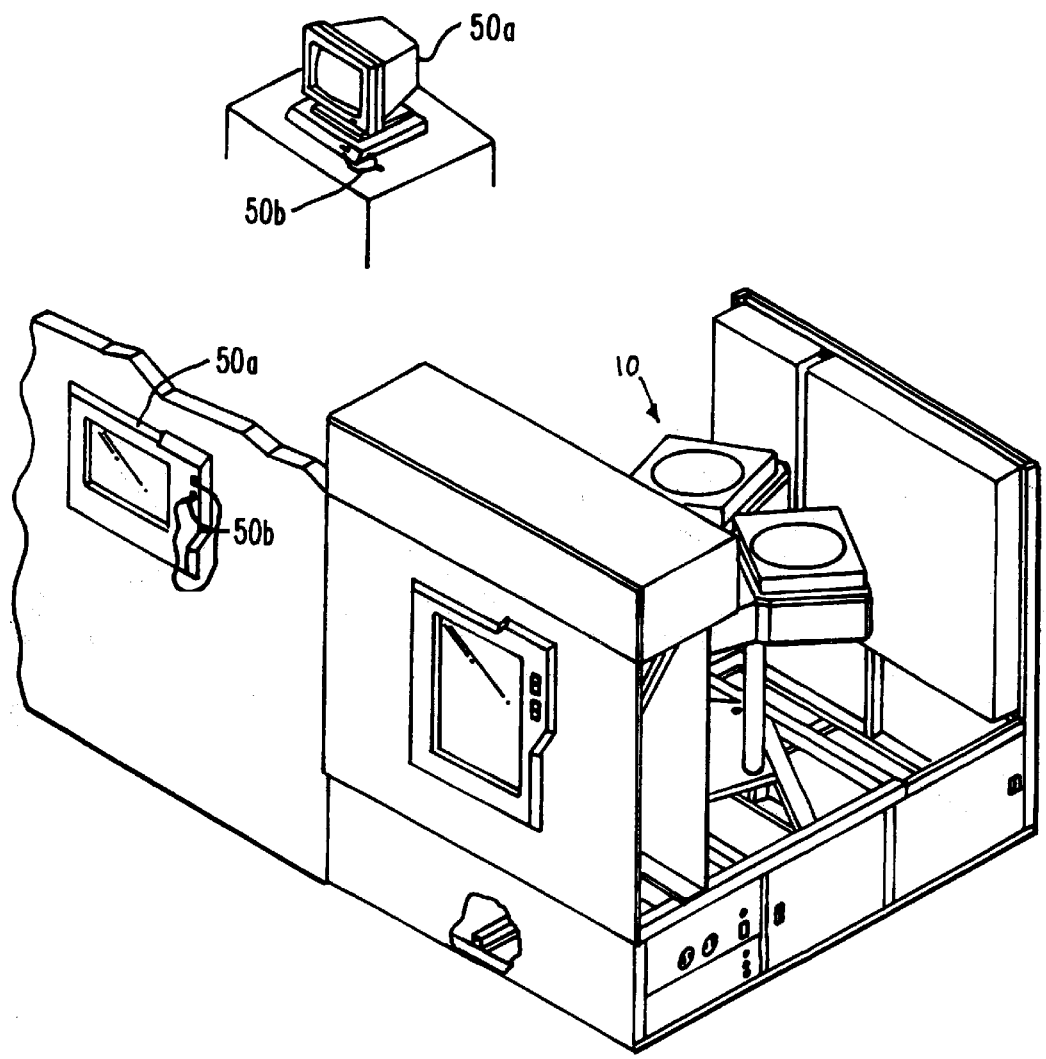
FIG. 1C is a simplified diagram of system monitor and CVD system 10 in a multichamber system, which may include one or more chambers.

Chamber 15 may be part of a vacuum processing system (such as shown in FIG. 1C) having multiple processing chambers connected to a central transfer chamber and serviced by a robot. Substrate 16 is brought into chamber 15 by a robot blade through a slit valve 26 in a sidewall of the chamber. Heater 12 is moveable vertically by means of a motor 20. Substrate 16 is brought into the chamber when heater 12 is in a first position 13 opposite slit valve 26. At position 13, substrate 16 is supported initially by a set of pins 22 that pass through and are coupled to heater 12. Pins 22 are driven by a single motor assembly.

As the pedestal is brought to a processing position 32 (as shown by the dotted line) opposite gas distribution manifold 14, pins 22 sink into pedestal 12 and substrate 16 is deposited onto pedestal 12. Once positioned on pedestal 12, the substrate is affixed to the pedestal by a vacuum clamping system (partially shown in FIG. 1B as grooves 50).

As it moves upward toward processing position 32, the substrate contacts a purge guide (or shadow ring) 54 and centers purge guide 54 with respect to the affixed substrate. When purge guide 54 is centered, it does not contact substrate but maintains a fixed 5–10 mil gap (shown in FIG. 1B) with the substrate for passage of purge gases between them. A set of bumper pins 52 on sidewall 51 of pedestal 12 helps minimize contact between purge guide 54 and pedestal 12, thereby reducing the generation of particles in the event that pedestal 12 and purge guide 54 contact each other in passing.

Purge guide 54 rests on the top of pedestal 12 when pedestal 12 is in processing position 32. Deposition and carrier gases are supplied through gas lines 7 to gas distribution plate 14 in response to the control of valves or mass flow controllers (MFCs) 17. During processing, gas supplied to manifold 14 is distributed uniformly across the surface of the substrate. Spent processing gases and by-product gases are exhausted from the chamber by means of an exhaust system 36, which includes exhaust channels. The rate at which gases are released through exhaust system 36 into an exhaust line is controlled by a throttle valve and vacuum pumping system (both not shown).

During deposition, purge gas feed line 38 can feed purge gas (indicated by arrows 28) against the edge of wafer 16.

Purge guide 54 is made of ceramic material, such as aluminum oxide or aluminum nitride. The edge of pedestal 12 upon which purge guide 54 rests during processing has a plurality of fine grooves 56, e.g., about 5–10 mil apart, to prevent sticking between purge guide 54 and the pedestal. Such sticking generates particles and can occur because of the difference in coefficients of expansion between metal, such as aluminum (pedestal), and ceramic (purge guide) parts: at processing temperatures as compared with room temperatures, aluminum expands about three times as much as ceramic. Thus, grooves 56 prevent the generation of particles when purge guide 54 and pedestal 12 are separated as the pedestal is lowered after processing of the substrate is complete. A second purge line 24 (FIG. 1A) can feed purge gas from the bottom of chamber 15 and protects stainless steel bellows 25 from damage due to corrosive gases introduced into the chamber during processing. An RF power supply 44 can be coupled to manifold 14 to provide for plasma-enhanced CVD (PECVD) cleaning of the chamber.

The throttle valve, gas supply valves or MFCs 17, motor 20, resistive heated pedestal 12, RF power supply 44 and other aspects of CVD system 10 are controlled by a processor 47 over control lines 46 (only some of which are shown). Acting as a system controller 34, processor 47 operates under the control of a computer program stored in a computer-readable medium such as a memory 48. The computer program dictates the temperature, chamber pressure, timing, mixture of gases, RF power levels, pedestal position, and other parameters of a particular process.

An example of such a CVD apparatus is described in U.S. Pat. No. 5,516,367 entitled "Improved Chemical Vapor Deposition Chamber," having Lawrence Lei, Ilya Perlov, Karl Littau, Alan Morrison, Mei Chang, and Ashok Sinha listed as inventors and assigned to Applied Materials, Inc., the assignee of the present invention, which is incorporated herein by reference for all purposes.

In a preferred embodiment, the system controller includes a hard disk drive (memory 48), a floppy disk drive and a processor 47. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 48. Preferably, memory 48 is a hard disk drive, but memory 48 may also be other kinds of memory. The computer program includes sets of instructions that dictate the timing, mixture of gases, chamber pressure, chamber temperature, RF power levels, heater/pedestal position, and other parameters of a particular process. Other computer programs stored on other memory devices, for example, a floppy disk or other appropriate drive, may also be used to operate controller 34.

The interface between a user and controller 34 is via a CRT monitor 50*a* and light pen 50*b*, shown in FIG. 1C which is a simplified diagram of the system monitor and CVD system 10 in a substrate processing system, which may include one or more chambers. In the preferred embodiment two monitors 50*a* are used, one mounted in the clean room wall for the operators and the other behind the wall for the service technicians. The monitors 50*a* simultaneously display the same information, but only one light pen 50*b* is enabled. A light sensor in the tip of light pen 50*b* detects light emitted by CRT display. To select a particular screen or function, the operator touches a designated area of the display screen and pushes the button on the pen 50*b*. The touched area changes its highlighted color, or a new menu or screen is displayed, confirming communication between the light pen and the display screen. Other devices, such as a keyboard, mouse, or other pointing or communication device, may be used instead of or in addition to light pen 50*b* to allow the user to communicate with controller 34.

The process for depositing the film can be implemented using a computer program product that is executed by controller 34. The computer program code can be written in any conventional computer-readable programming language: for example, 68000 assembly language, C, C++, Pascal, Fortran or others. Suitable program code is entered into a single file, or multiple files, using a conventional text editor, and is stored or embodied in a computer-usable medium, such as a memory system of the computer. If the entered code text is in a high-level language, the code is compiled, and the resultant compiler code is then linked with an object code of precompiled windows library routines. To execute the linked, compiled object code the system user invokes the object code, causing the computer system to load the code in memory. The CPU then reads and executes the code to perform the tasks identified in the program.

Figure 1D:
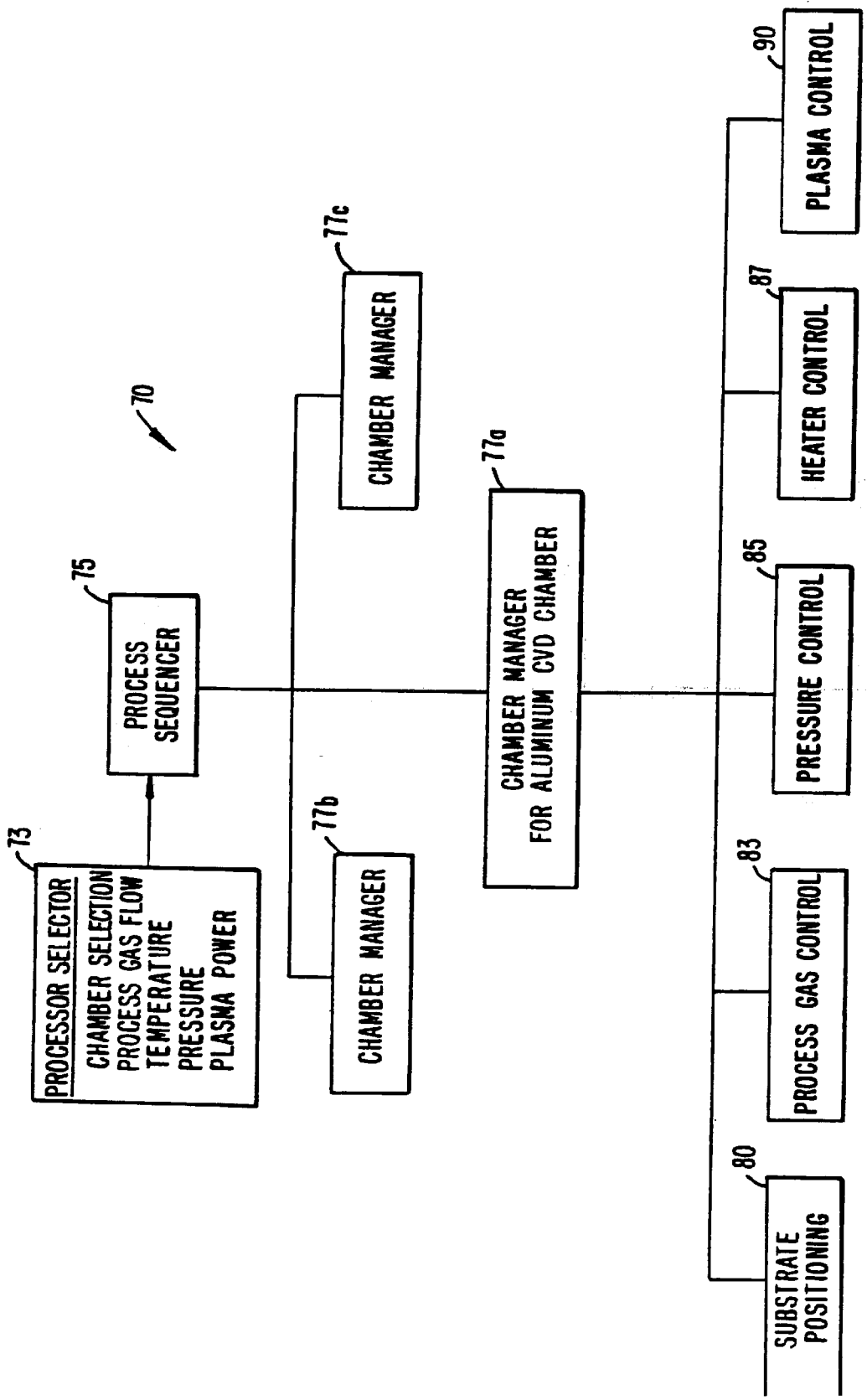
FIG. 1D shows an illustrative block diagram of the hierarchical control structure of the system control software, computer program 70, according to a specific embodiment.

FIG. 1D is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73 and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 15 according to the process set determined by the sequencer subroutine 75. For example, the chamber manager subroutine 77a comprises program code for controlling CVD and related process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1D. The substrate positioning subroutine 80 comprises program code for controlling chamber components that are used to load the substrate onto heater 12 and, optionally, to lift the substrate to a desired height in the chamber 15 to control the spacing between the substrate and gas distribution plate 14. When a substrate is loaded into the process chamber 15, heater 12 is lowered to receive the substrate, and thereafter, heater 12 is raised to the desired height in the chamber to maintain the substrate at a first distance or spacing from the gas distribution manifold during the CVD process. In operation, the substrate positioning subroutine 80 controls movement of heated pedestal 12 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Process gas control subroutine 83 also is programmed to include steps for flowing the passivation gas, in accordance with the present invention, into chamber 15. Additionally, when a process gas is to be vaporized from a liquid precursor, for example, dimethylaluminum hydride ("DMAH"), the process gas control subroutine 83 is written to include steps for bubbling a delivery gas, such as argon or helium, through the liquid precursor in a bubbler assembly or introducing a carrier gas, such as argon or helium, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping set-point pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure manometers connected to the chamber, to compare the measured value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in a heater 12, comparing the measured temperature to the setpoint temperature, and increasing or decreasing current applied to the heating unit to obtain the set-point temperature. The temperature is obtained from the measured voltage by looking up the corresponding temperature in a stored conversion table or by calculating the temperature using a fourth-order polynomial. When an embedded loop is used to heat pedestal 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15 and for setting the low frequency RF frequency employed. Similarly to the previously described chamber component subroutines, the plasma control subroutine 90 is invoked by the chamber manager subroutine 77*a*.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in heater design, RF power frequencies, location of RF power connections and others are possible. For example, the wafer could be supported and heated by quartz lamps or other heating technique. The layer and method of the present invention is not limited to any specific apparatus or to any specific plasma excitation method.

II. Exemplary Structure

Figure 2:
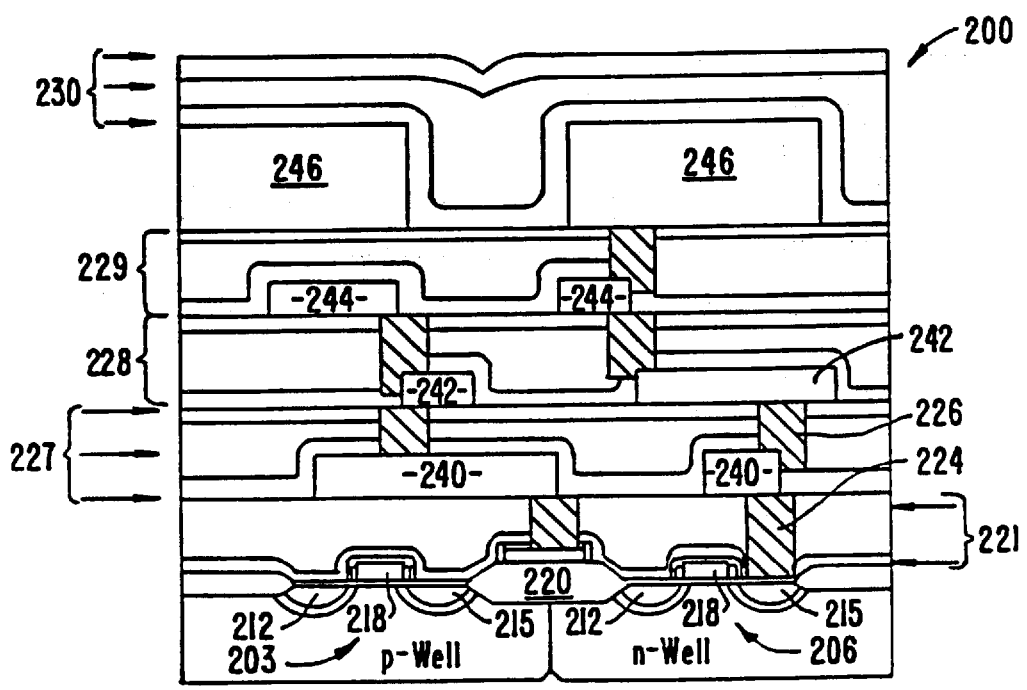
FIG. 2 is a simplified cross-sectional view of a semiconductor device manufactured according to an embodiment of the present invention.

FIG. 2 illustrates a simplified cross-sectional view of an integrated circuit 200 according to the present invention. As shown, integrated circuit 200 includes NMOS and PMOS transistors 203 and 206, which are separated and electrically isolated from each other by a field oxide region 220 formed by local oxidation of silicon (LOCOS) or other technique. Alternatively, transistors 203 and 206 may be separated and electrically isolated from each other by a shallow trench isolation (not shown) when transistors 203 and 206 are both NMOS or both PMOS. Each transistor 203 and 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers 240, 242, 244, and 246, included in integrated circuit 200. Each metal layer 240, 242, 244, and 246 is separated from adjacent metal layers by respective intermetal dielectric layers 227, 228, and 229. Adjacent metal layers are connected at selected openings by vias 226. Deposited over metal layer 246 are planarized passivation layers 230. CVD apparatus 10 may be used to deposit metal films used, for example, as metal layers 240, 242, 244 and 246, or as vias 226.

It should be understood that simplified integrated circuit 200 is for illustrative purposes only. One of ordinary skill in the art could implement the present method for fabrication of other integrated circuits such as microprocessors, application specific integrated circuits (ASICs), memory devices, and the like. Further, the present invention may be applied to PMOS, NMOS, CMOS, bipolar, or BiCMOS devices. Although aluminum deposition may be used to deposit metal layers or vias discussed above, the present invention also may be used in other applications where aluminum or other metal deposited by CVD is desired. Although integrated circuit 200 discussed above has four metal layers, integrated circuits having additional or even fewer metal layers also may be fabricated using the present invention.

Exemplary wafer deposition and chamber passivating processes for in situ or individual operation within chamber 15 are further described below, in accordance with various embodiments of the present invention.

III. Exemplary Chemical Vapor Deposition Process

The method of the present invention may be used to passivate the inside aluminum surfaces of exemplary CVD apparatus 10, or other CVD apparatus, and thereby minimize accumulation of unwanted aluminum deposition on components and parts of CVD apparatus 10. A process for the CVD deposition of an aluminum film over a substrate is illustrated below as an example of an aluminum CVD operation that leaves unwanted aluminum material deposited within chamber 15 after a deposition process, and as an example of a process for which after its completion, the method of the present invention may be used to minimize the unwanted deposited material from the chamber walls, heater, and other process kit parts. While the method of the present invention is particularly useful in removing unwanted aluminum material, it is understood that the illustration below is for exemplary purposes only and that the method of the present invention is not limited to cleaning or removing material deposited from the exemplary process.

In the exemplary process, an aluminum film is deposited over a wafer positioned in processing chamber 15. In the aluminum deposition process, a process gas including dimethylaluminum hydride (DMAH) with a carrier gas such as argon (Ar) is introduced into the chamber at a rate of preferably about 200–500 standard cubic centimeters per minute (sccm) through gas lines 7 to gas distribution plate 14 in response to valves or MFCs 17. DMAH is a liquid source that may be vaporized by a liquid injection system and mixed with a carrier gas such as argon so that the DMAH/carrier gas flow ratio is about 1:2. Heater 12 is heated to a temperature of preferably between about 200°–300° C., and chamber 15 is pressurized to a pressure of preferably between about 5–25 torr. Heater 12 is moved to a processing position of preferably about 300–500 mil from gas distribution plate 14. Optionally, an edge purge gas such as helium or argon may be used during the deposition to prevent deposition on the edge and backside of the wafer and of heater 12 as described in reference to the exemplary chamber. The purge gas does not, however, prevent deposition from all unwanted areas of the chamber, and therefore does not alleviate the need for a dry clean step or other step to minimize unwanted aluminum deposition.

In one preferred exemplary process, the process gas including DMAH with argon is introduced into the chamber at a rate of about 200–500 sccm, as heater 12 (and the wafer thereon) is heated to about 265° C. and pressure is maintained at about 5 torr. During deposition, heated pedestal 12 is about 350 mil from gas distribution plate 14. Thus, an aluminum film may be deposited onto the surface of the wafer by allowing the deposition to proceed for a certain time. For aluminum deposition processes at lower temperatures or higher temperatures, the deposition time would be longer or shorter, respectively, to achieve a film of a predefined thickness. Also, the flow rates (discussed in the above and below sections) are for an AxZ chamber (equipped for 200-mm wafers and having a total volume of about 6 liters) manufactured by Applied Materials. Of course, other similar chambers also may be used.

IV. Chamber Passivation

The present invention may be employed to minimize unwanted aluminum deposition material that builds up within chamber 15 during deposition sequences such as the exemplary aluminum process described above. In the method of the present invention, a passivation gas, preferably nitrogen ($N_2$) gas, is introduced into chamber 15 between aluminum deposition of a wafer or wafers. Although the preferred embodiment utilizes nitrogen gas, other gases such as $O_2$, moisture ($H_2O$), nitrous oxide ($N_2O$), nitrocoxide or other gases containing nitrogen and/or oxygen may be used in other embodiments.

The technique of the present invention preferably may be employed to passivate chamber 15 after every aluminum deposition or substrate processing operation step in a wafer run in that chamber or may be employed after every n wafers have been processed. According to specific embodiments, the nitrogen passivating gas is introduced at a flow rate preferably of about 100–2000 sccm, while chamber 15 is maintained at a pressure of preferably about 0.1–100 torr, most preferably about 10–90 torr. The passivation gas is preferably introduced into chamber 15 by the edge and/or bottom purge lines. In other embodiments, the passivation gas also may be introduced via faceplate 14. During the passivation process, the spacing between heater 12 and the gas distribution plate may be preferably about 300–1500 mil. The temperature of heated pedestal 12 preferably remains at the temperature used for the above-discussed aluminum deposition process. The introduction of the passivating gas, nitrogen, into chamber 15 at these conditions lasts preferably between about 1–300 seconds, most preferably about 10–120 seconds. When chamber 15 is maintained at a lower pressure, the passivation time should be increased.

Figure 3:
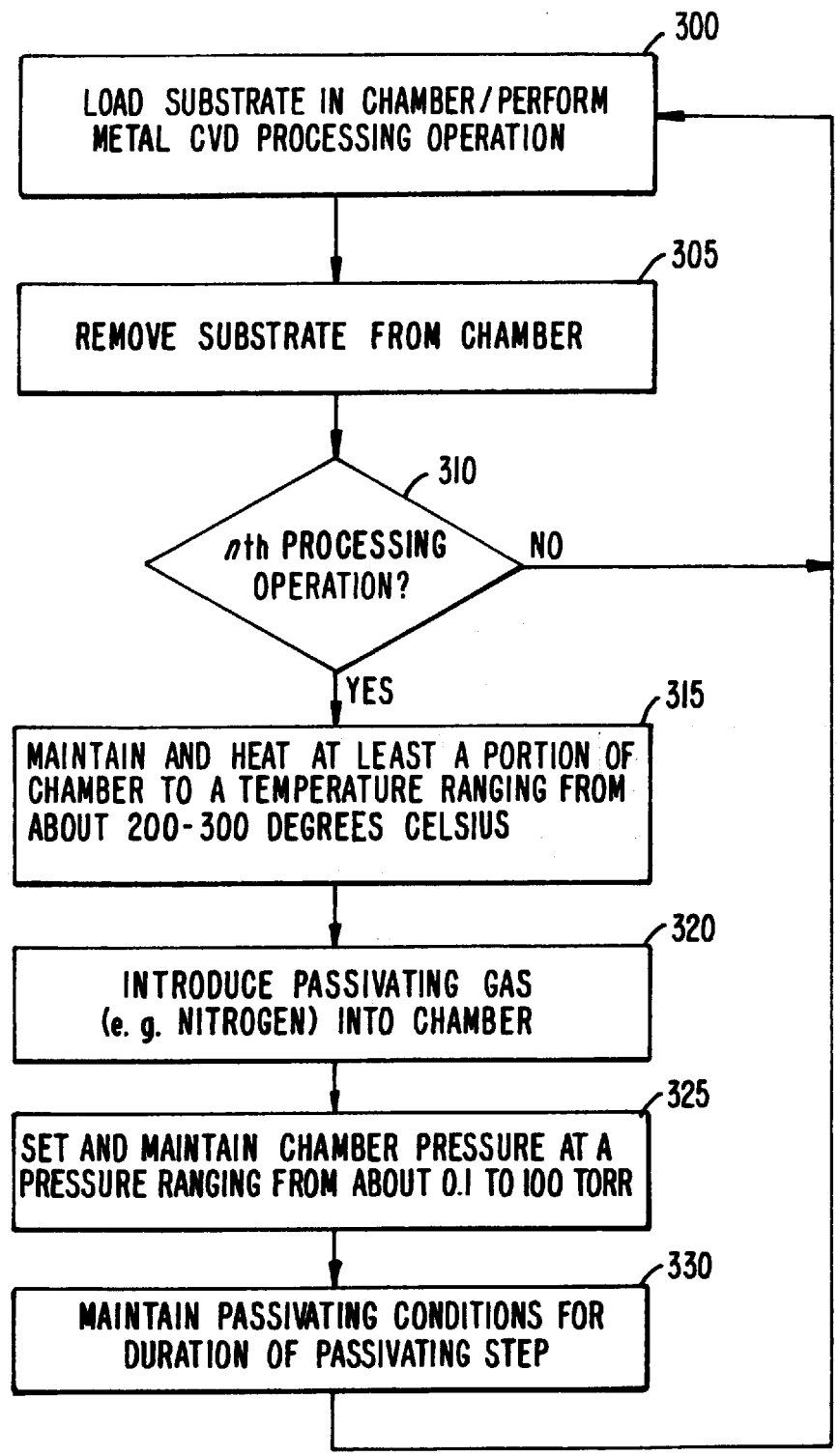
FIG. 3 is a simplified flow chart of a straight wafer run of one embodiment of the method of the present invention.

FIG. 3 is a simplified flow chart of a straight wafer run of one embodiment of the method of the present invention. Upon start of the straight run, a substrate is loaded into the chamber and processed according to the exemplary aluminum deposition process described above or by another processing operation (step 300). After completion of the substrate processing operation, the substrate is removed from the chamber (step 305) and a determination is made by controller 34 as to whether the passivation step should be performed (step 310). The passivation step is performed after every n substrates are processed, where typically n is between about 1–25. For processing operations used for specific applications in which aluminum build-up is a great concern, n is preferably 1. If n processing operations have been performed, the system proceeds to step 315. If n processing operations have not yet been performed, then the system returns to step 300 for another metal CVD process operation.

In step 315, at least a portion of the chamber, e.g. resistively heated pedestal 12, is heated (or remains heated at the deposition temperature from the metal CVD process of step 300) to a temperature preferably ranging from about 200°–300° C., most preferably about 265° C., and the passivating gas, nitrogen in a preferred embodiment, is introduced into the chamber (step 320) at a flow rate preferably ranging between about 100–2000 sccm, most preferably about 500–1000 sccm. Pressure within the chamber is set and maintained at a level preferably about 0.1–100 torr, most preferably about 10–90 torr (step 325). Higher temperatures and pressure levels than those discussed above also may be used and may be desirable in certain situations.

The selected passivating conditions are maintained for the duration of the passivation step (step 330). The duration of the passivation step depends on the temperature and pressure used in the passivation step. The passivation conditions last preferably between about 1–300 seconds, most preferably about 10–120 seconds. For lower pressures and temperatures, the duration of the passivation step is extended. However, these conditions may be optimized to permit an effective passivation while minimizing the time duration of the passivation step, so that wafer throughput is not unduly affected. Once passivation is completed for the appropriate time duration, the system returns to step 300 for another metal CVD processing operation.

As described above, use of nitrogen advantageously passivates fresh aluminum films and makes them highly resistant to further CVD aluminum growth. The nitrogen forms an aluminum nitride (AlN) film on all exposed aluminum surfaces and makes them resistant to further aluminum CVD growth. When the passivation step is periodically repeated, any small amount of growth which might occur on the AlN surface is also passivated. Accordingly, it is believed that periodically performance of the passivation step can extend the life spans of the expensive heater 12 and other process kit parts possibly up to about 10–100 times their current life spans (about 5000 wafers for about 0.5 mm total aluminum deposition) as measured by number of wafers processed. It is projected that the life span of these components may be increased from about 5000 wafers (about 0.5 mm total aluminum deposition) to up to about 50000–500000 wafers (about 5–50 mm total aluminum deposition).

The above-discussed embodiments illustrate the passivation step being performed between every wafer or every n wafers. However, in alternative embodiments, the passivation step may be performed post-deposition while the wafer remains in chamber 15.

It is to be understood that the above description is intended to be illustrative and not restrictive. Many embodiments will be apparent to those of skill in the art upon reviewing the above description. By way of example, the inventions herein have been illustrated primarily with regard to a specific aluminum process recipe and a specific passivation process recipe, but they are not so limited. As previously stated, the method of the present invention is not limited to minimizing unwanted aluminum accumulation within a chamber from the above exemplary aluminum process. Instead, the present invention is equally applicable to minimizing material from aluminum CVD processes that employ other aluminum-containing gases, other than vaporized DMAH with carrier gas (discussed above for a specific embodiment). As another example, the deposition of an aluminum film has been described using a carrier gas such as argon, but other carrier gases like helium or hydrogen, may be used as well. Further, a passivation gas of fluorine or of oxygen may be used in certain embodiments; however, they may be too reactive since these gases may react with the aluminum hydride chemicals used for some embodiments of CVD aluminum deposition. Those skilled in the art will recognize other equivalent or alternative methods of depositing the metal layer while remaining within the scope of the claims of the present invention. Still further, although the invention is described above with reference to CVD apparatus 10 having a heated pedestal 12, the present invention may also be used with CVD apparatus using quartz lamps or other heating technique to heat the substrate. The scope of the invention should, therefore, be determined not with reference to the above description, but should instead be determined with reference to the appended claims, along with the full scope of equivalents to which such claims are entitled.

What is claimed is:

1. A method of reducing future unwanted aluminum deposition inside a substrate processing chamber after an aluminum chemical vapor deposition (CVD) substrate processing operation, said method comprising the steps of:

flowing a nitrogen-containing passivating gas into said chamber after said aluminum CVD substrate processing operation, said aluminum CVD substrate processing operation conducted at a processing temperature of about 200°–300° C.; and maintaining at least a portion of said chamber at said processing temperature during said flowing step, said chamber being at a first pressure of about 0.1–100 torr during said flowing step;

wherein said method passivates unwanted aluminum deposition formed during said aluminum CVD substrate processing operation thereby reducing future unwanted aluminum build-up from depositing on said unwanted aluminum deposition within said chamber.

2. The method of claim 1 wherein said nitrogen-containing passivating gas flowing step lasts for about 10–300 seconds.

3. The method of claim 2 wherein said nitrogen-containing passivating gas is selected from the group consisting of $N_2$, $N_2O$ and NO.

4. The method of claim 3 wherein said nitrogen-containing passivating gas flowing step lasts for about 10–120 seconds.

5. The method of claim 2 wherein said processing temperature is about 265° C.

6. The method of claim 2 wherein said aluminum CVD substrate processing operation can be performed repeatedly to deposit greater than 0.5 millimeter of total desired aluminum deposition without requiring replacement of chamber parts.

7. The method of claim 1 wherein said aluminum CVD substrate processing operation is conducted at a processing pressure of about 5–25 torr.

8. The method of claim 1 wherein particles and residue are deposited inside said chamber by said aluminum CVD substrate processing operation and wherein said aluminum CVD processing operation involves a reaction of an aluminum-containing gas comprising dimethylaluminum hydride (DMAH).

9. The method of claim 8 wherein said nitrogen-containing passivating gas flowing step is performed between every 1–25 substrates that are subjected to said aluminum CVD substrate processing operation.

10. The method of claim 8 wherein said flowing step is performed after every substrate that is subjected to said aluminum CVD substrate processing operation.

11. The method of claim 1 wherein said first pressure is about 10–90 torr.

12. The method of claim 1, said method further comprising the steps of:

introducing a substrate into said chamber;

performing said aluminum CVD substrate processing operation on said substrate in said chamber to deposit a desired aluminum film on said substrate and an unwanted aluminum film on areas of said chamber; and removing said substrate from said chamber; and wherein said method is used to fabricate an integrated circuit in said chamber.

13. The method of claim 12 wherein said substrate removing step is performed before said flowing step.

14. The method of claim 12 wherein said aluminum CVD substrate processing operation performing step comprises the steps of:

flowing a process gas including an aluminum-containing gas into said chamber; and heating said portion of said chamber to said processing temperature.

15. The method of claim 14 wherein said process gas flowing step flows said process gas including said aluminum-containing gas comprising dimethylaluminum hydride (DMAH).

16. The method of claim 15 wherein said process gas also includes argon.

17. The method of claim 14 wherein said process gas flowing step flows said process gas at about 200–500 sccm flow rate to said chamber having a volume of about 6 liters.

18. The method of claim 1 wherein said flowing step uses $N_2$ gas at a flow rate of about 100–2000 sccm into said chamber having a volume of about 6 liters.

19. The method of claim 18 wherein said flow rate is about 500–1000 sccm.

20. The method of claim 1 wherein said nitrogen-containing passivating gas is flowed into said chamber via purge lines of said chamber.

21. The method of claim 20 wherein said nitrogen-containing passivating gas is flowed into said chamber via edge and/or bottom purge lines of said chamber.

22. The method of claim 20 wherein said nitrogen-containing passivating gas is also flowed into said chamber via a faceplate of said chamber.

* * * * *